(12) United States Patent
Gouda et al.

(10) Patent No.: US 12,426,304 B2
(45) Date of Patent: Sep. 23, 2025

(54) SEMICONDUCTOR DEVICE AND METHOD OF MANUFACTURING THE SAME

(71) Applicant: DENSO CORPORATION, Kariya (JP)

(72) Inventors: Kenta Gouda, Kariya (JP); Yusuke Nonaka, Kariya (JP); Takeshi Hagino, Kariya (JP)

(73) Assignee: DENSO CORPORATION, Kariya (JP)

( * ) Notice: Subject to any disclaimer, the term of this patent is extended or adjusted under 35 U.S.C. 154(b) by 410 days.

(21) Appl. No.: 18/172,498

(22) Filed: Feb. 22, 2023

(65) Prior Publication Data

US 2023/0207688 A1 Jun. 29, 2023

Related U.S. Application Data

(63) Continuation of application No. PCT/JP2021/030996, filed on Aug. 24, 2021.

(30) Foreign Application Priority Data

Aug. 26, 2020 (JP) .................................. 2020-142629

(51) Int. Cl.
*H10D 30/66* (2025.01)
*H10D 30/01* (2025.01)
(Continued)

(52) U.S. Cl.
CPC ....... *H10D 30/668* (2025.01); *H10D 30/0297* (2025.01); *H10D 62/127* (2025.01); *H10D 64/513* (2025.01)

(58) Field of Classification Search
CPC ............. H10D 30/668; H10D 30/0297; H10D 62/127; H10D 64/513
(Continued)

(56) References Cited

U.S. PATENT DOCUMENTS

| 4,908,682 A | 3/1990 | Takahashi | |
|---|---|---|---|
| 2011/0169103 A1* | 7/2011 | Darwish | H10D 62/158 257/E29.262 |

(Continued)

FOREIGN PATENT DOCUMENTS

JP 2013-201361 A 10/2013

OTHER PUBLICATIONS

U.S. Appl. No. 18/172,426, filed Feb. 22, 2023, Takizawa et al.

*Primary Examiner* — Igwe U Anya
(74) *Attorney, Agent, or Firm* — Posz Law Group, PLC

(57) ABSTRACT

A semiconductor device has a cell portion and a peripheral portion. The cell portion includes a semiconductor substrate, a first impurity region, a second impurity region, and a contact region for the second impurity region. The semiconductor substrate has a drift layer. The first impurity region is on the drift layer. The second impurity region is on a surface layer portion of the first impurity region. A length of the cell portion is identical to a length of the second impurity region in one direction. The contact region extends from the cell portion to the peripheral portion. A length of a section of the contact region at the peripheral section in the one direction is defined as a protruding length, and a length of the second impurity region is defined as a second-impurity-region length. A ratio of the protruding length to the second-impurity-region length is 0.1 or smaller.

7 Claims, 13 Drawing Sheets

(51) Int. Cl.
  *H10D 62/10* (2025.01)
  *H10D 64/27* (2025.01)
(58) Field of Classification Search
  USPC .......................................................... 257/330
  See application file for complete search history.

(56) References Cited

U.S. PATENT DOCUMENTS

| | | | |
|---|---|---|---|
| 2013/0069147 A1* | 3/2013 | Ohta ................. | H10D 30/0297 |
| | | | 438/270 |
| 2019/0189756 A1* | 6/2019 | Okumura ............. | H10D 30/668 |
| 2021/0184031 A1* | 6/2021 | Yamamoto ........... | H10D 62/393 |

* cited by examiner

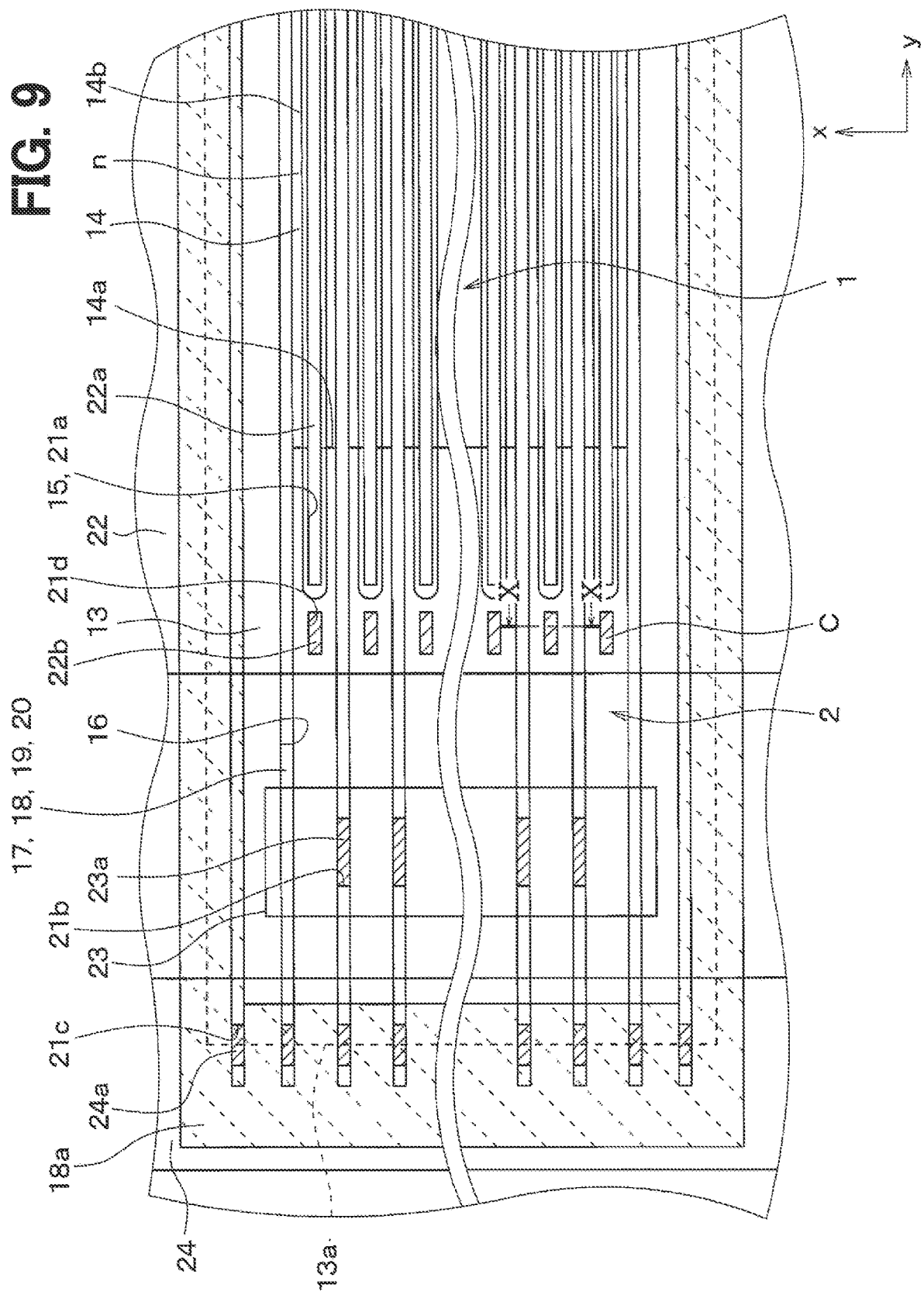

SEMICONDUCTOR DEVICE AND METHOD OF MANUFACTURING THE SAME

CROSS REFERENCE TO RELATED APPLICATIONS

The present application is a continuation application of International Patent Application No. PCT/JP2021/030996 filed on Aug. 24, 2021, which designated the U.S. and claims the benefit of priority from Japanese Patent Application No. 2020-142629 filed on Aug. 26, 2020. The entire disclosures of all of the above applications are incorporated herein by reference.

TECHNICAL FIELD

The present disclosure relates to a semiconductor device and a method of manufacturing the semiconductor device.

BACKGROUND

A semiconductor device may have a cell portion and a peripheral portion, and may have a trench-gate structure with double gates in the cell portion. In such a semiconductor device, a semiconductor substrate may have an $n^-$ type drift layer on an $n^+$ drain layer.

SUMMARY

The present disclosure describes a semiconductor device having a cell portion and a peripheral portion, and further describes a method of manufacturing the semiconductor device including preparation of a semiconductor substrate and formation of a contact trench.

BRIEF DESCRIPTION OF DRAWINGS

FIG. 9 is an upper surface layout diagram of a semiconductor device according to a second embodiment.

DETAILED DESCRIPTION

Figure 1:
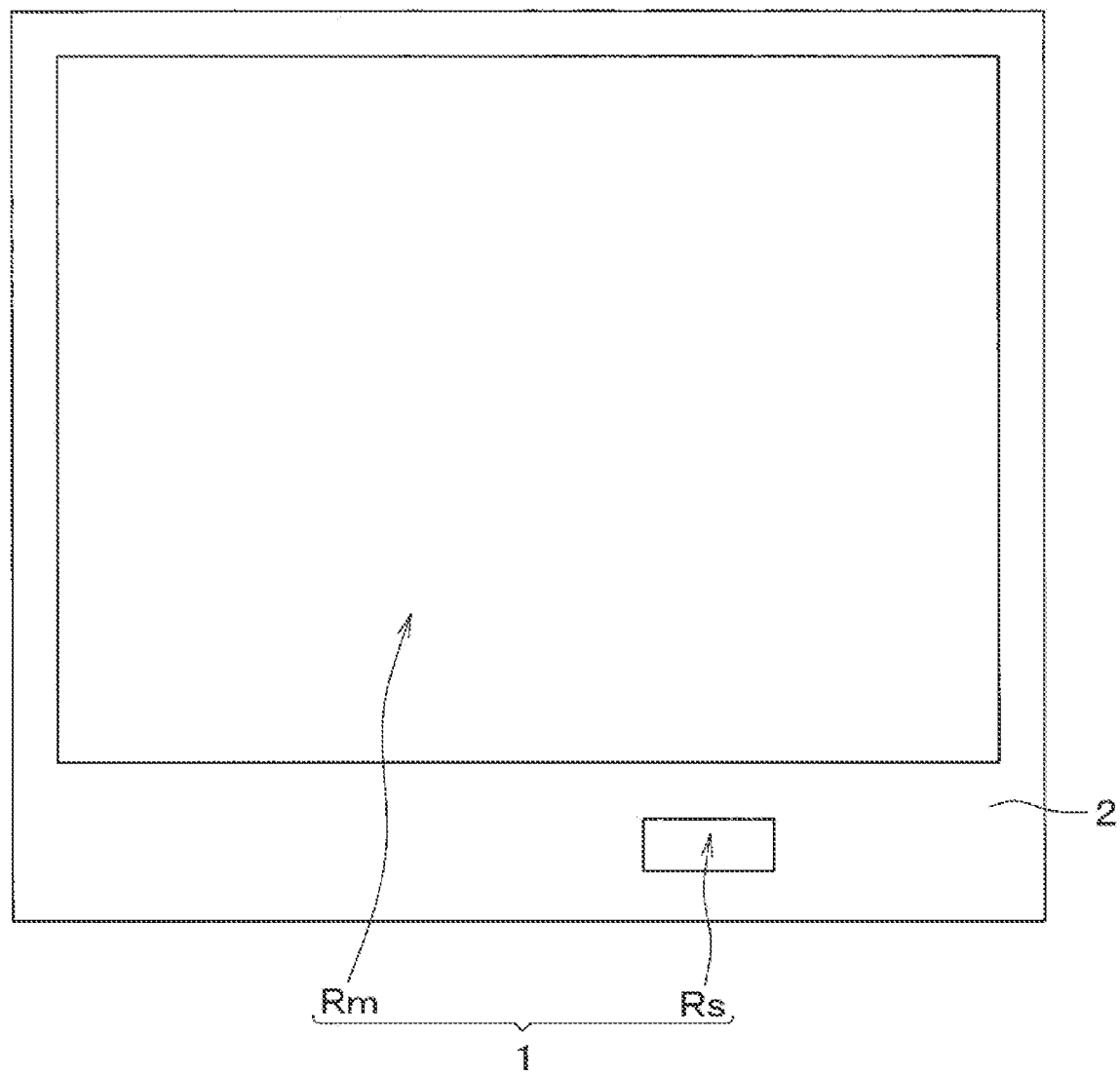
FIG. 1 is a schematic view of a semiconductor device according to a first embodiment.

In a semiconductor device, a body region and a source region may be formed at a surface layer portion of a semiconductor substrate. At the semiconductor substrate, a trench-gate structure may be formed to penetrate the body region and the source region and reach a drift layer. In the trench-gate structure of the semiconductor device, a shield electrode serving as a source potential may be arranged through a shield insulating film at a bottom side of a gate trench while a gate electrode may be arranged through a gate insulating film at an opening side of the gate trench. Therefore, it is possible to reduce a parasitic capacitance generated between the gate electrode and a drain electrode. An intermediate insulating film may be formed between the shield electrode and the gate electrode.

An upper electrode electrically connected to the body region and the source region may be arranged at the semiconductor substrate while a lower electrode electrically connected to a drain layer may be arranged at the semiconductor substrate.

In such a semiconductor device, a contact trench may be formed at the semiconductor substrate, and the upper electrode may be electrically connected to the body region and the source region through the contact trench.

In this situation, it is possible to reduce a contact resistance between the upper electrode and the semiconductor substrate by forming a contact region for the source region along the contact trench. The contact region has a higher impurity concentration than the source region. The contact region for the source region may be formed around the contact trench by, for example, using a mask identical to a mask used for forming the contact trench.

In such a semiconductor device, a parasitic bipolar transistor may operate through an avalanche operation. In a situation where the contact trench is formed, it is possible to inhibit the operation of the parasitic bipolar transistor in the semiconductor device and enhance avalanche resistance by extending the contact trench from the cell portion to the peripheral portion.

In such a semiconductor device, the cell portion may include a main cell region and a sense cell region. A current flowing through the sense cell region is smaller than a current flowing through the main cell region. The sense region may have a structure identical to the main cell region. In the semiconductor device, the current flowing through the main region may be detected based on the current flowing through the sense cell region.

In a situation where the contact trench is formed at the semiconductor substrate and the cell portion has the main cell region and the sense cell region, the precision of current detection may decrease. In other words, the length of the contact region for the source region protruding to the peripheral portion may be excessively long by extending the contact trench from the cell portion to the peripheral portion. In this situation, in the sense cell region, as the proportion of the current flowing through the peripheral portion increases, the proportion of the current flowing through the sense cell region decreases. Therefore, the precision of current detection may decrease.

According to a first aspect of the present disclosure, a semiconductor device includes a cell portion and a peripheral portion. The cell portion includes a semiconductor element. The cell portion has a main cell region and a sense cell region. The main cell region has a structure identical to the sense cell region, and the sense cell region enables a flow of a smaller current than the main cell region. The peripheral portion surrounds the cell portion. The semiconductor element in each of the main cell region and the sense cell region includes a semiconductor substrate, a first impurity region, a second impurity region, multiple trench-gate structures, a contact trench, a contact region, a high-concentration layer, an interlayer insulating film, a first electrode, and a second electrode. The semiconductor substrate is a first conductivity type and has a drift layer. The first impurity region is located on the drift layer and is a second conductivity type. The second impurity region is located on a surface layer portion of the first impurity region, and the second impurity region is a first conductivity type and has a higher impurity concentration than the drift layer. The trench-gate structures are arranged in a stripe shape. Each of the trench-gate structures further includes a gate trench, a shield electrode, an intermediate insulating film, a gate electrode, and an insulating film. Each of the gate trenches has one direction as a longitudinal direction of each of the gate trenches while penetrating the first impurity region from the second impurity region and reaching the drift layer. Each of the trench-gate structures has double gates by stacking the shield electrode, the intermediate insulating film and the gate electrode in order via the insulating film in the gate trench. The contact trench is located between adjacent two of the trench-gate structures. The contact trench has the one direction as a longitudinal direction of the contact trench, and the contact trench extends from the cell portion to the peripheral portion while penetrating the second impurity region and reaching the first impurity region. The contact region for the second impurity region is located along a wall surface of the contact trench, and the contact region has a higher impurity concentration than the second impurity region. The high-concentration layer is the first conductivity type or the second conductivity type, and the high-concentration layer is located on a side opposite from the first impurity region with the drift layer sandwiched between the first impurity region and the high-concentration layer. The interlayer insulating film has a contact hole communicating with the contact trench, and the interlayer insulating film is located on the first impurity region, the second impurity region, and the trench-gate structures. The first electrode is electrically connected to the contact region and the first impurity region through the contact hole and the contact trench. The second electrode is electrically connected to the high-concentration layer. A length of the cell portion in the one direction is identical to a length of the second impurity region in the one direction. The contact region extends from the cell portion to the peripheral portion. A length of a section of the contact region located at the peripheral portion in the one direction is defined as a protruding length, and the length of the second impurity region in the one direction is defined as a second-impurity-region length. A ratio of the protruding length to the second-impurity-region length is 0.1 or smaller.

Accordingly, it is possible to enhance the avalanche resistance while decreasing a fluctuation of the ratio between the current flowing through the main cell region and the current flowing through the sense cell region. Therefore, it is possible to enhance the avalanche resistance while inhibiting a decrease in the precision of current detection.

According to a second aspect of the present disclosure, a method of manufacturing the semiconductor device as described above includes preparation of the semiconductor substrate, formation of the contact region for the second impurity region, and formation of the contact trench at the semiconductor substrate. A length of the cell portion in the one direction is identical to a length of the second impurity region in the one direction. The contact region extends from the cell portion to the peripheral portion. The length of a section of the contact region located at the peripheral portion in the one direction is defined as a protruding length, and the length of the second impurity region in the one direction is defined as a second-impurity-region length. In the formation of the contact region for the second impurity region, the ratio of the protruding length to the second-impurity-region length is set to be 0.1 or smaller.

Therefore, it is possible to manufacture the semiconductor device that enhances the avalanche resistance while inhibiting a decrease in the precision of current detection.

Embodiments of the present disclosure will be described below with reference to the drawings. In the following embodiments, the same reference numerals are assigned to parts that are the same or equivalent to each other.

First Embodiment

A first embodiment will be described with reference to the drawings. The following describes a first embodiment. The present embodiment describes a semiconductor device as a semiconductor element including a vertical n-channel metal oxide semiconductor field effect transistor (MOSFET) having a trench-gate structure with double gates. The trench-gate structure with double gates may also be referred to as a dual-gate trench-gate structure or a double-gate trench-gate structure.

As illustrated in FIG. 1, the semiconductor device according to the present embodiment includes a cell portion 1 and a peripheral portion 2. The cell portion 1 has a main cell region Rm as a main cell and a sense cell region Rs as a sense cell. The main cell region Rm and the sense cell region Rs are provided with the MOSFETs with the identical structures, and are isolated from each other.

An area ratio is adjusted for the main cell region Rm and the sense cell region Rs such that the current flowing through the main cell is decreased by only a predetermined ratio to flow in the sense cell region Rs. Although not particularly limited, a size of the sense cell region Rs is a fraction of several hundreds to several tens of thousands of a size of the main cell region Rm. In the semiconductor device, since the flowing current is proportional to the area ratio, the current flowing to the main cell region Rm is detected based on the current flowing through the sense cell region Rs. The semiconductor device according to the present embodiment includes a source region 14. In the present embodiment, the cell portion 1 and the peripheral portion 2 are divided based on whether the source region 14 is formed. The cell portion 1 is a portion where the source region 14 is formed.

As illustrated in FIGS. 2 to 5, the following describes the structure of the semiconductor device such that a width direction of the MOSFET is defined as an x-direction, the depth direction of the MOSFET intersecting the x-direction is defined as a y-direction. The main cell region Rm and the sense cell region Rs in the cell portion 1 have the identical structures. Therefore, the structure of the cell portion 1 described in the following is applied to both of the main cell region Rm and the sense cell region Rs. The y-direction corresponds to one direction.

Figure 3:
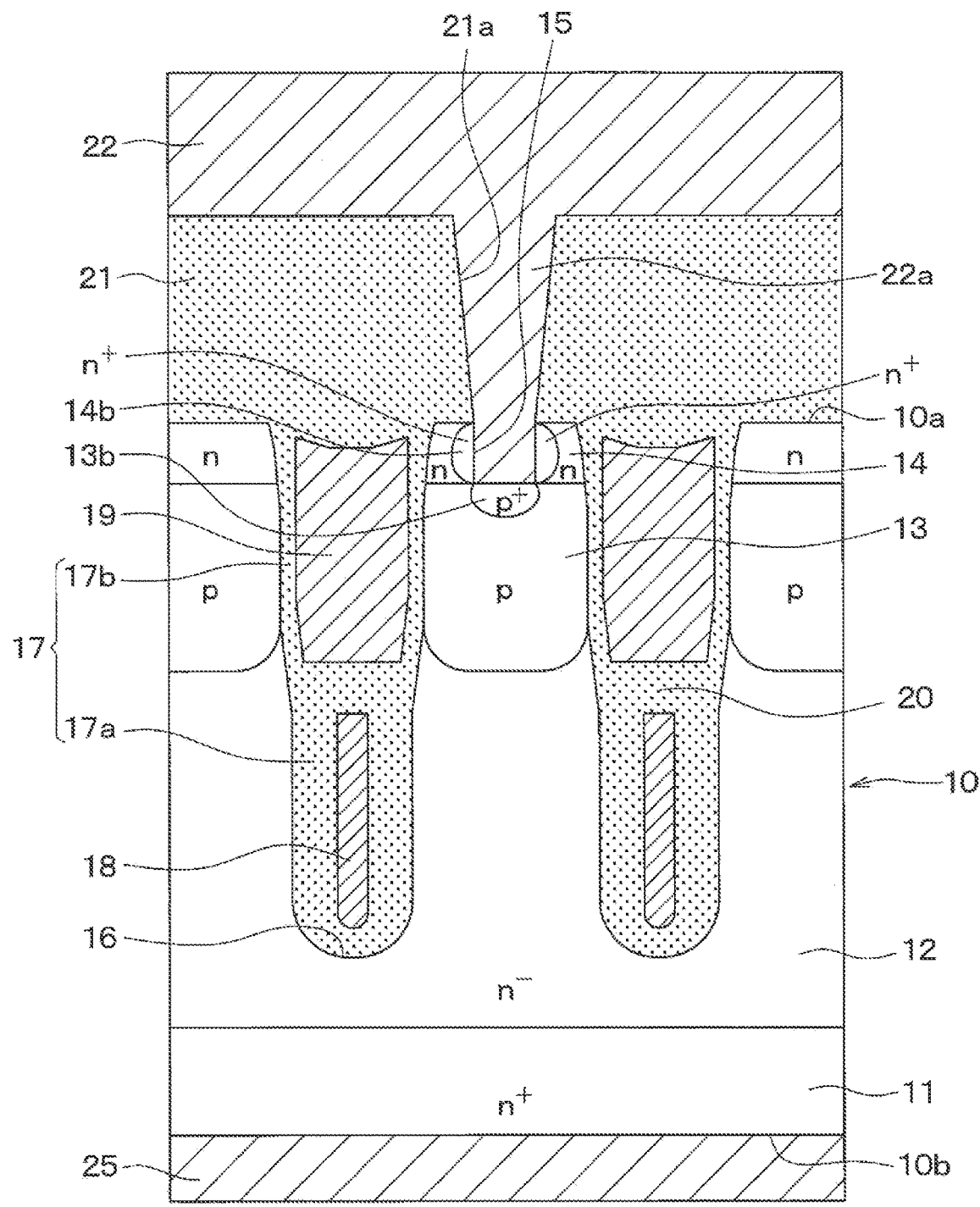
FIG. 3 is a cross-sectional view taken along line III-III shown in FIG. 2.
Figure 4:
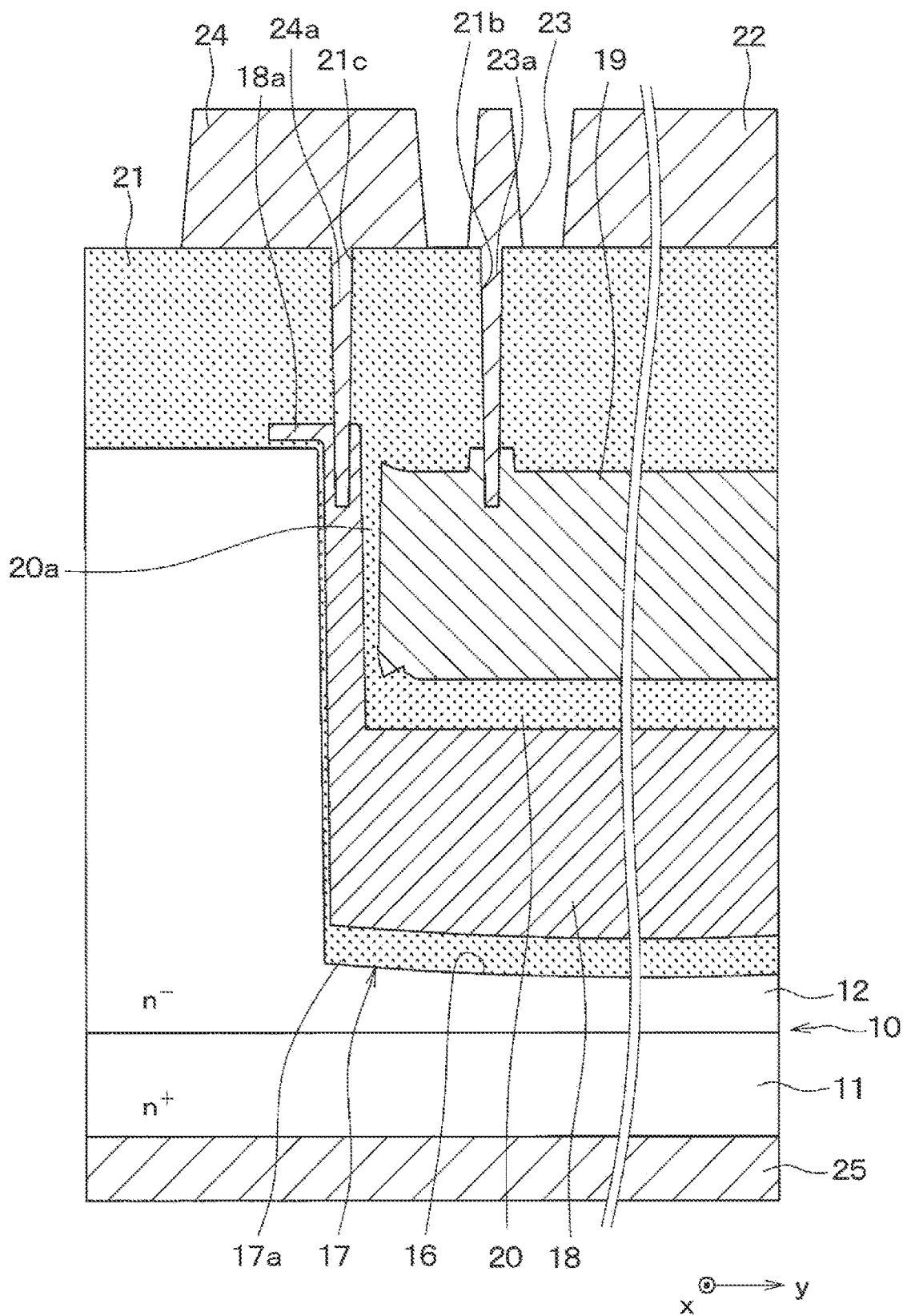
FIG. 4 is a cross-sectional view taken along line IV-IV shown in FIG. 2.
Figure 5:
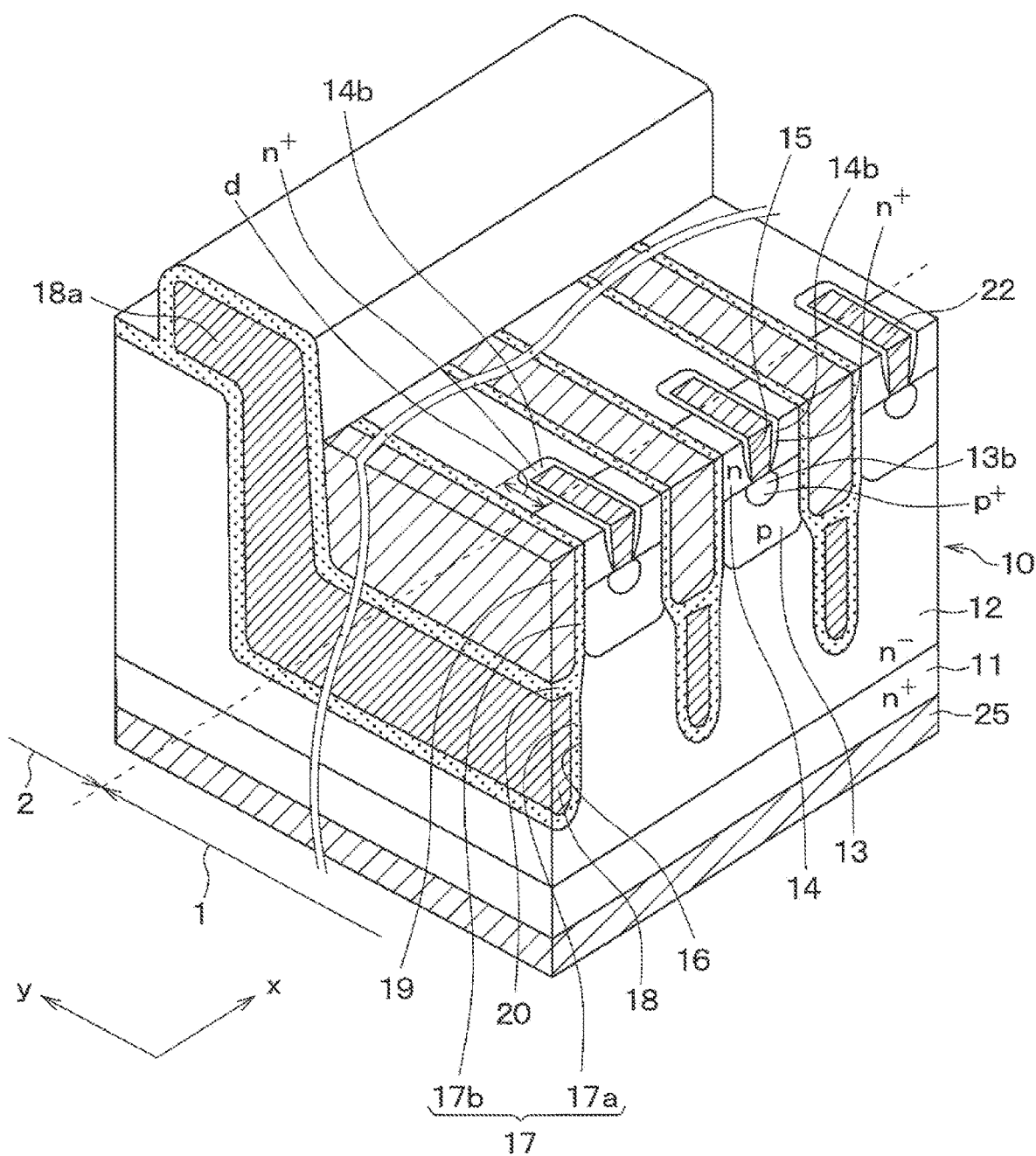
FIG. 5 is a perspective schematic view of the semiconductor device according to the first embodiment.

As shown in FIGS. 3 to 5, the semiconductor device according to the present embodiment is formed with the use of an n+ type semiconductor substrate 10 having a substrate 11 made of a semiconductor material such as silicon having a relatively high impurity concentration. On the surface of the substrate 11, an n− type drift layer 12 having an impurity concentration lower than that of the substrate 11 is formed. In the present embodiment, the substrate 11 functions as a drain layer, and corresponds to a high-concentration layer.

Figure 2:
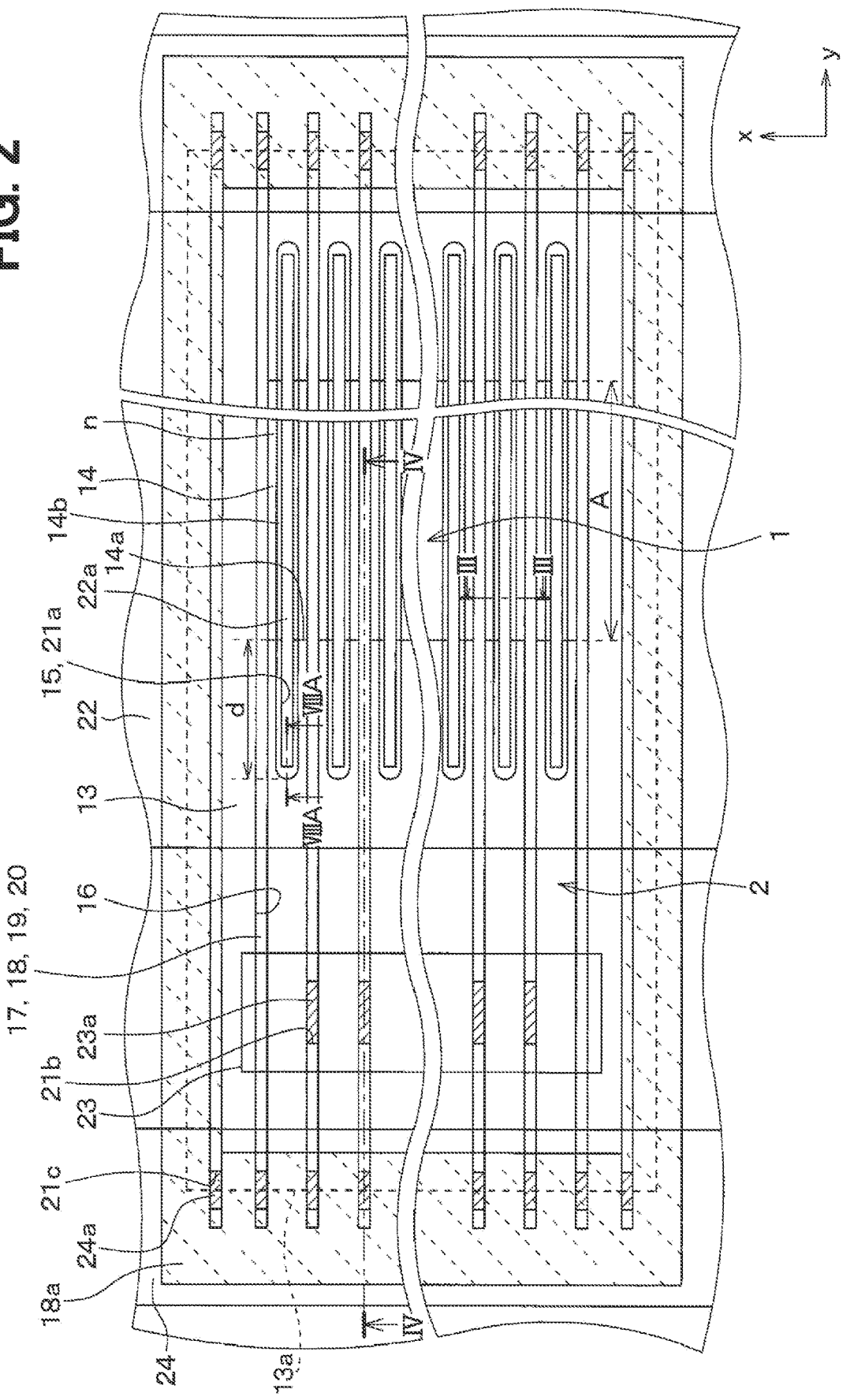
FIG. 2 is an upper surface layout diagram of the semiconductor device according to a first embodiment.

Further, a p-type body region 13 having a relatively low impurity concentration is formed at a certain position in the surface layer portion of the drift layer 12. The body region 13 is formed by, for example, ion-implanting a p-type impurity into the drift layer 12, and also functions as a channel layer for forming a channel region. As shown in FIG. 2, the body region 13 is formed with the y-direction as the longitudinal direction among multiple trench-gate structures described later. As illustrated in FIG. 2, the body region 13 extends from the cell portion 1 to the peripheral portion 2. In FIG. 2, the boundary between a portion where the body region 13 is formed and a portion where the body region 13 is not formed is indicated by a broken line as a body-region boundary portion 13a.

A surface layer portion of the body region 13 is provided with an n-type source region 14 having a higher impurity concentration than the drift layer 12. As shown in FIG. 2, the source region 14 is formed with the y-direction as the longitudinal direction among multiple trench-gate structures described later. The source region 14 is formed to be terminated inside the body region 13. In the present embodiment, a portion where the source region 14 is formed is configured as the cell portion 1. In FIG. 2, the boundary between a portion where the source region 14 is formed and a portion where the source region 14 is not formed is indicated as a source-region boundary portion 14a. In the present embodiment, the body region 13 corresponds to a first impurity region, and the source region 14 corresponds to a second impurity region.

Multiple contact trenches 15 are respectively formed at the semiconductor substrate 10 to penetrate the source region 14 and reach the body region 13. Therefore, the body region 13 is exposed at the bottom surface of the contact trench 15. At the portion of the body region 13 exposed from the contact trench 15, a p+ type contact region 13b for the body region that serves as a contact for the body region is formed. At a portion of the source region 14 exposed from the side surface of the contact trench 15, a contact region 14b for the source region that serves as a contact is formed. In the present embodiment, the contact region 14b for the source region corresponds to a contact region for the second impurity region.

As shown in FIG. 2, the contact trench 15 is formed with the y-direction as the longitudinal direction among multiple trench-gate structures. The contact trench 15 is formed to protrude from the source region 14 in the y-direction. In other words, the contact trench 15 is formed from the cell portion 1 to the peripheral portion 2. However, the contact trench 15 is formed to be terminated inside the body region 13 in the y-direction. The contact trenches 15 are formed to be arranged in the x-direction, and are respectively formed among the trench-gate structures. In other words, the contact trenches 15 are laid out in a stripe shape arranged in parallel at regular intervals.

The contact region 14b for the source region is formed around the contact trench 15 as illustrated in FIGS. 2 and 5. In other words, the contact region 14b for the source region is formed to surround the contact trench 15 at a first surface 10a of the semiconductor substrate 10. Therefore, in the present embodiment, the contact region 14b for the source region protrudes from the source region 14 in the y-direction. In other words, the contact region 14b for the source region extends to the peripheral portion 2.

Multiple gate trenches 16 arranged in the x-direction and having the y-direction (that is, one direction) as the longitudinal direction are formed between the body region 13 and the source region 14 at the surface layer portion of the drift layer 12. The gate trench 16 is a trench for forming a trench-gate structure, and in the present embodiment, the gate trenches 16 are arranged in parallel at equal intervals to form a layout with a stripe shape.

Each of the gate trenches 16 extends from the cell portion 1 to the peripheral portion 2 in the y-direction. In the present embodiment, the gate trench 16 is formed to protrude from the body region 13 at the peripheral portion 2 as illustrated in FIG. 2. In other words, the body region 13 is terminated inside the gate trench 16 in the extending direction in the y-direction.

The gate trench 16 is formed to be deeper than the body region 13. In other words, the gate trench 16 may be formed to penetrate the source region 14 and the body region 13 from the first surface 10a side of the semiconductor substrate 10 and reach the drift layer 12. Further, in the present embodiment, the width of the gate trench 16 gradually narrows toward the bottom of the gate trench 16, and the bottom of the gate trench 16 is rounded.

Multiple gate trenches 16 are formed such that the gate trenches 16 located at both ends in the x-direction are located at the peripheral portion 2. Therefore, the gate trenches 16 located at both ends in the x-direction are formed to penetrate the body region 13 and reach the drift layer 12.

An inner wall surface of the gate trench 16 is covered with an insulating film 17. The insulating film 17 according to the present embodiment includes a shield insulating film 17a and a gate insulating film 17b. The shield insulating film 17a covers a lower portion of the gate trench 16, and the gate insulating film 17b covers an upper portion of the gate trench 16. The shield insulating film 17a is formed to cover the side surface of the lower portion of the gate trench 16 from the bottom portion of the gate trench 16. The gate insulating film 17b is formed to cover the side surface of the upper portion of the gate trench 16.

A shield electrode 18 and a gate electrode 19 are stacked via the insulating film 17 inside the gate trench 16. The shield electrode 18 and the gate electrode 19 are made of doped Poly-Si. In other words, double gates are arranged inside the gate trench 16.

The shield electrode 18 are fixed to the source potential by connecting to an upper electrode 22. In the semiconductor device according to the present embodiment, it is possible to reduce the capacitance between the gate and the trench while enhancing the electrical characteristics of the MOSFET. The gate electrode 19 performs a switching operation of the vertical MOSFET, and forms a channel region in the body region 13 on the side surface of the gate trench 16 when a gate voltage is applied.

An intermediate insulating film 20 is formed between the shield electrode 18 and the gate electrode 19. Therefore, the shield electrode 18 and the gate electrode 19 are insulated. The gate trench 16, the insulating film 17, the shield electrode 18, the gate electrode 19, and the intermediate insulating film 20 configure a trench-gate structure. The trench-gate structures are formed in a layout with a stripe shape in which the multiple gate trenches 16 are arranged in the x-direction parallel to an up-down direction of the drawing of FIG. 2. The longitudinal direction of the gate trench 16 is in the y-direction parallel to a left-right direction of the drawing of FIG. 2.

The source region 14 is formed at an inner portion of the trench-gate structure in the longitudinal direction, and the cell portion 1 functions as the MOSFET in the inner portion. A tip portion of the trench-gate structure outside the cell portion 1 is located at the peripheral portion 2.

As illustrated in FIG. 4, at the tip portion of the gate trench 16 in the longitudinal direction, the shield electrode 18 extends outward from the gate electrode 19. Then, those portions are exposed from the surface side of the body region 13 and the source region 14 as a shield liner 18a. At the end portion of the gate trench 16 in the longitudinal direction, a portion of the shield electrode 18 extending outward from the gate electrode 19 and the tip of the gate electrode 19 are insulated by a tip portion 20a of the intermediate insulating film 20.

In the present embodiment, the shield liner 18a is routed to surround the cell portion 1. Although FIG. 2 is not a cross-sectional view, the shield liner 18a is hatched for easy understanding. Also in the drawings corresponding to FIG. 2 described later, the shield liner 18a is hatched for easy understanding.

An interlayer insulating film 21 made of, for example, an oxide film for covering the gate electrode 19 is formed at the first surface 10a side of the semiconductor substrate 10. As illustrated in FIG. 3, a first contact hole 21a is formed at the interlayer insulating film 21. The first contact hole 21a communicates with the contact trench 15 formed at the semiconductor substrate 10.

In the present embodiment, the contact trench 15 and the contact region 14b for the source region are formed as follows. After forming the first contact hole 21a at the interlayer insulating film 21, the interlayer insulating film 21 is formed as a mask. The contact region 14b for the source region is formed by thermal diffusion through ion implantation of impurity through the first contact hole 21a. After forming the contact region 14b for the source region, the interlayer insulating film 21 is again formed as the mask. The contact trench 15 is formed to penetrate the contact region 14b for the source region and communicate with the first contact hole 21a. In the present embodiment, the contact region 14b for the source region and the contact trench 15 are formed by adopting the identical mask as the identical interlayer insulating film 21. The contact region 14b for the source region is formed around the contact trench 15.

As illustrated in FIGS. 2 and 4, a second contact hole 21b and a third contact hole 21c are formed at the interlayer insulating film 21. The second contact hole 21b exposes the gate electrode 19 at the peripheral portion 2, and the third contact hole 21c exposes the shield liner 18a at the peripheral portion 2.

The upper electrode 22 corresponds to a source electrode. The upper electrode 22, a gate wiring 23 and a shield wiring 24 are formed on the interlayer insulating film 21. The upper electrode 22 are formed to be electrically connected to the body region 13 (in other words, the contact region 13b for the body region) and the source region 14 (in other words, the contact region 14b for the source region) through a connecting portion 22a at the cell portion 1, as illustrated in FIGS. 2 and 3. The connecting portion 22a is made of, for example, a tungsten (W) plug, and is embedded in the first contact hole 21a formed at the interlayer insulating film 21 and the contact trench 15. In the present embodiment, the upper electrode 22 corresponds to a first electrode.

As illustrated in FIG. 4, the gate wiring 23 is electrically connected to the gate electrode 19 through a connecting portion 23a such as a tungsten (W) plug in the second contact hole 21b formed at the interlayer insulating film 21. The shield wiring 24 is formed to be electrically connected to the shield electrode 18 through a connecting portion 24a such as a tungsten (W) plug embedded in the third contact hole 21c formed at the interlayer insulating film 21. Although FIG. 2 is not a cross-sectional view, for better understanding, a portion of the gate electrode 19 connected to the gate wiring 23 and a portion of the shield electrode 18 connected to the shield wiring 24 are hatched. Also in the drawings corresponding to FIG. 2 described later, the above portions are hatched for better understanding.

Further, a lower electrode 25 corresponding to a drain electrode is formed on a surface of the substrate 11 on a side opposite from the drift layer 12. The lower electrode 25 is formed at a second surface 10b of the semiconductor substrate 10. In the present embodiment, the lower electrode 25 corresponds to a second electrode. The vertical MOSFET in the present embodiment is formed by such a structure.

The structure of the semiconductor device according to the present embodiment has been described above. In the present embodiment, $n^-$ type, n-type, and $n^+$ type correspond to the first conductivity type, and p-type and $p^+$ type correspond to the second conductivity type. In the present embodiment, the semiconductor substrate 10 includes, for example, the substrate 11, the drift layer 12, the body region 13, and the source region 14.

In such a semiconductor device, as similar to a MOSFET, when a predetermined voltage or larger is applied to the gate electrode 19, a channel is formed at a portion of the body region 13 in contact with the gate trench 16, and the semiconductor is turned to an on-state as the current flows between the source and the drain. When the voltage applied to the gate electrode 19 becomes smaller than the predetermined voltage, the channel formed at the body region 13 disappears, and the semiconductor device is turned to an off-state as the current is cut off.

In such a semiconductor device as described above, the drift layer 12, the body region 13 and the source region 14 form a parasitic bipolar transistor. In such a semiconductor device as described above, when the on-state is turned to the off-state, an excessive amount of current may flow between the source and the drain through the operation of the parasitic bipolar transistor caused by the avalanche operation.

Therefore, in the present embodiment, the contact trench 15 is formed to the peripheral portion 2. As a result, when the semiconductor device has the avalanche operation, it is possible to extract the holes generated at the peripheral portion 2 from the contact trench 15 formed up to the peripheral portion 2. Therefore, it is possible to inhibit the operation of the parasitic bipolar transistor while enhancing the avalanche resistance.

The contact region 14b for the source region and the contact trench 15 in the present embodiment may adopt the identical mask. The contact region 14b for the source region is formed around the contact trench 15. When the length of the contact trench 15 protruding to the peripheral portion 2 is increased, the length of the contact region 14b for the source region also becomes longer.

Figure 6:
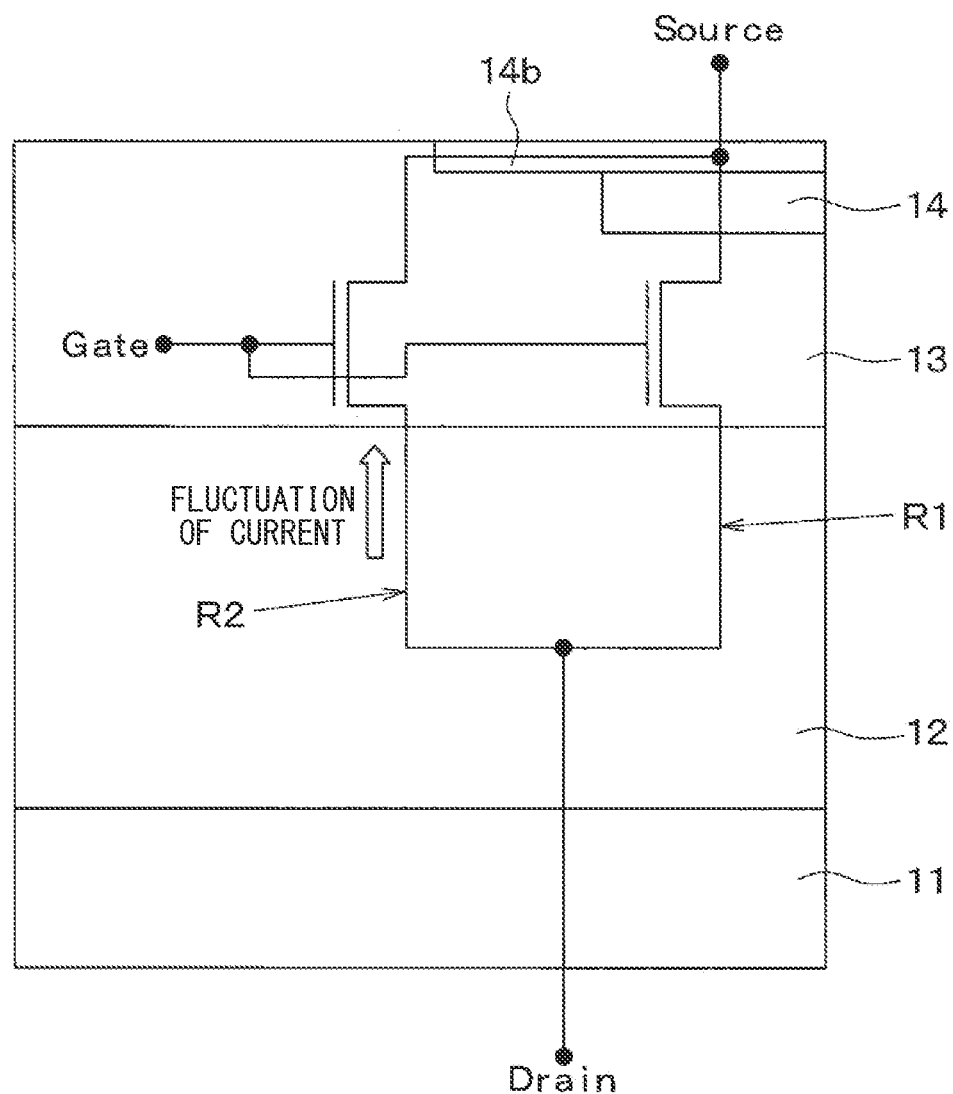
FIG. 6 is a schematic view of a current path when the semiconductor device is in an on-state.

When the semiconductor device is in the on-state, the current flows between the source and the drain. As illustrated in FIG. 6, the current flows through a main path R1 in an order of the substrate 11, the drift layer 12, the body region 13, the source region 14 and the contact region 14b for the source region. The current flows through a parasitic path R2 in an order of the drift layer 12, the body region and the contact region 14b for the source region. The main path R1 is the current that flows only through the cell portion 1, and the parasitic path R2 is the current that flows through the peripheral portion 2. When the length of the contact region 14b for the source region protruding to the peripheral portion 2 is increased, the current flowing in the parasitic path R2 increases, and the current flowing through the main path R1 decreases.

The area of the sense cell region Rs is infinitesimal as compared to the area of the main cell region Rm. As compared with the main cell region Rm, the fluctuation of the current caused by an increase in the current of the parasitic path R2 cannot be neglected. In other words, when the length of the contact trench 15 protruding to the peripheral portion 2 is increased, although the avalanche resistance can be enhanced, the rate of decrease in the flowing current in the sense cell region Rs becomes larger.

Figure 7:
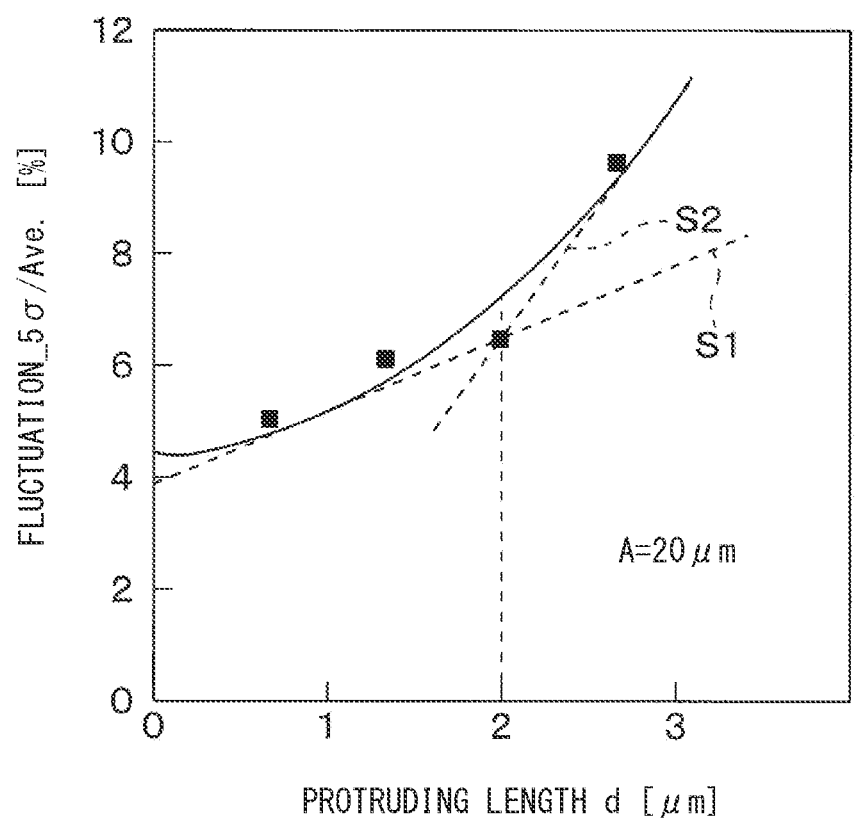
FIG. 7 illustrates a simulation result related to a relationship between a protruding length and a fluctuation of a ratio between a current flowing through a main region and a current flowing through a sense cell region.

As illustrated in FIGS. 2 and 5, the inventors in the present application made the following review such that a length of a portion of the contact region 14b for the source region protruding in the y-direction from the cell portion 1 is defined as a protruding length d. The inventors in the present application made a review related to the protruding length d and a fluctuation of the ratio between the current flowing in the main cell region Rm and the current flowing in the sense cell region Rs. The inventors in the present application acquired the results illustrated in FIG. 7. As illustrated in FIG. 2, FIG. 7 illustrates a measurement result in a situation where a source-region length A as the length of the source region 14 in the y-direction is set to 20 micrometers (μm). The length of the source region 14 in the y-direction is the length of the gate trench 16 in the longitudinal direction, and is the length of the sense cell region Rs in the longitudinal direction.

As shown in FIG. 7, it is confirmed that the fluctuation increases as the protruding length is increased. The fluctuation suddenly increases when the protruding length d is set to 2 μm or larger. FIG. 7 illustrates an approximation line indicating the relationship between the protruding length d and the fluctuation. The approximate line suddenly increases at the intersecting point between a first tangent line S1 and a second tangent line. The first tangent line S1 is at the portion of the approximation line where the slope starts to increase. A second tangent line S2 is at the portion of the approximation line where the slope is maximum. In other words, when the protruding length is 2 μm or larger, the approximation line suddenly increases.

The influence of the current flowing through the parasitic path R2 on the current flowing through the main path R1 decreases as the current flowing through the main path R1 increases, and decreases as the current flowing through the parasitic path R2 decreases. The influence of the current flowing through the parasitic path R2 on the current flowing through the main path R1 decreases as the length of the sense cell region Rs in the y-direction is increased, and decreases as the protruding length d is decreased. The length of the sense cell region Rs in the sense cell region Rs in the y-direction, in other words, the length of the source region 14 in the y-direction for the fluctuation and the protruding length d are inversely proportional to each other.

In FIG. 7, since the source-region length A is 20 μm, it can be said that when d/A, which is the ratio of the protruding length d to the source region length A, exceeds 0.1, the fluctuation suddenly increases. In the present embodiment, the source-region length A and the protruding length d are defined so that the ratio d/A of the protruding length d to the source region length A is 0.1 or smaller. In the present embodiment, the source-region length A corresponds to a second-impurity-region length or a second length. The ratio of the protruding length d to the source-region length A is simply referred to as d/A in the following.

The following describes a method of manufacturing the above semiconductor device. The following describes a manufacturing method related to the contact trench 15 and the contact region 14b for the source region with reference to FIGS. 8A to 8D. Each of FIGS. 8A to 8D corresponds to a cross-sectional surface along the VIIIA-VIIIA line in FIG. 2.

Figure 8A:
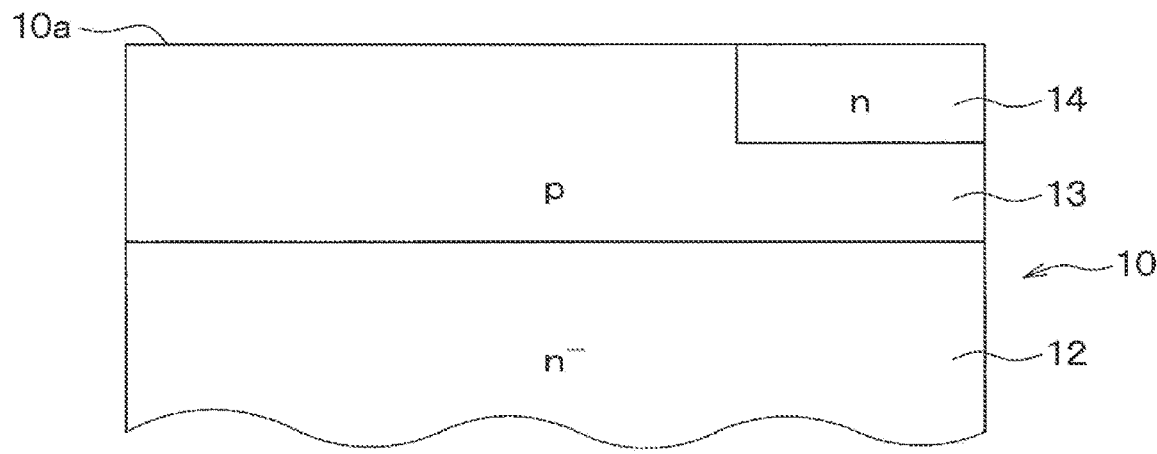
FIG. 8A is a cross-sectional view of a manufacturing process of the semiconductor device according to the first embodiment.

As illustrated in FIG. 8A, the semiconductor substrate 10 is prepared. The body region 13, the source region 14 and the like are formed at the semiconductor substrate 10.

Figure 8B:
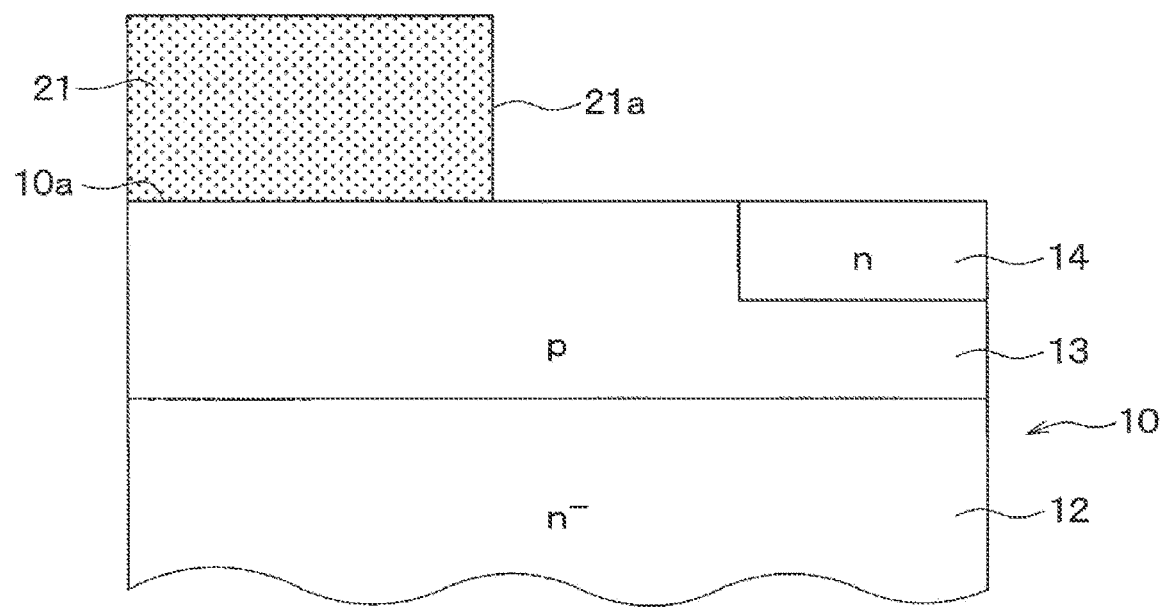
FIG. 8B is a manufacturing process of the semiconductor device following FIG. 8A.
Figure 8C:
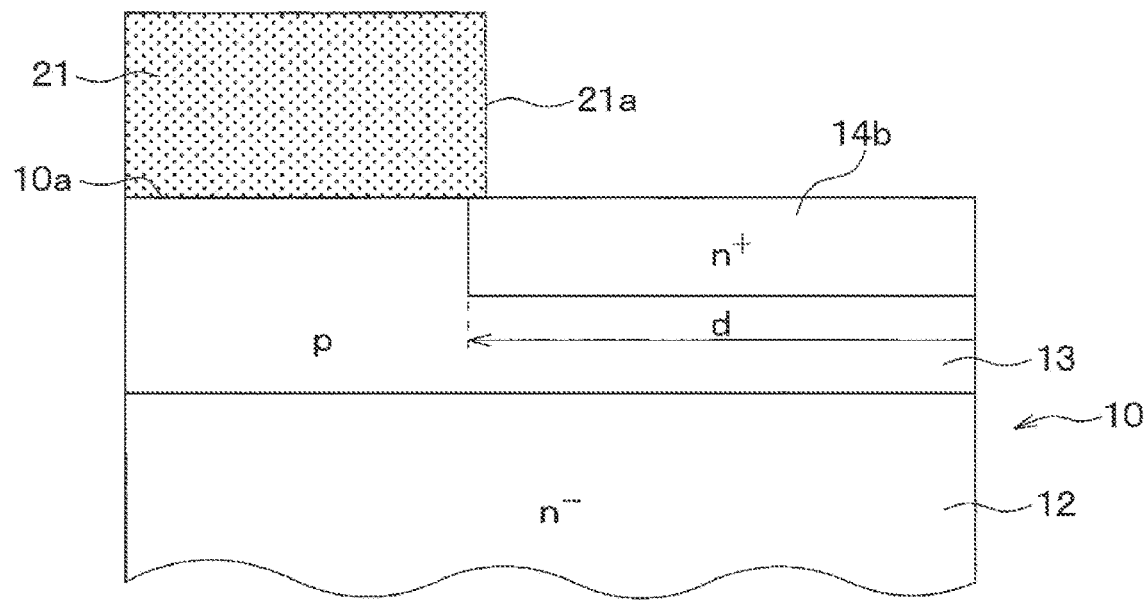
FIG. 8C is a cross-sectional view of a manufacturing process of the semiconductor device following FIG. 8B.

Subsequently, as illustrated in FIG. 8B, the interlayer insulating film 21 is formed at the first surface 10a of the semiconductor substrate 10, and the first contact hole 21a is formed at the interlayer insulating film 21. Subsequently, as illustrated in FIG. 8C, the interlayer insulating film 21 is adopted as a mask, and the contact region 14b for source region is formed by ion implantation of impurities for forming the contact region 14b for the source region through the first contact hole 21a and thermal diffusion. At this time, the contact region 14b for the source region is formed such that d/A is 0.1 or smaller. The length of the first contact hole 21a formed at the interlayer insulating film 21 in the y-direction is defined so that d/A is 0.1 or smaller. Since the contact region 14b for the source region is formed by thermal diffusion, the contact region 14b for the source region is formed directly below the interlayer insulating film 21.

Figure 8D:
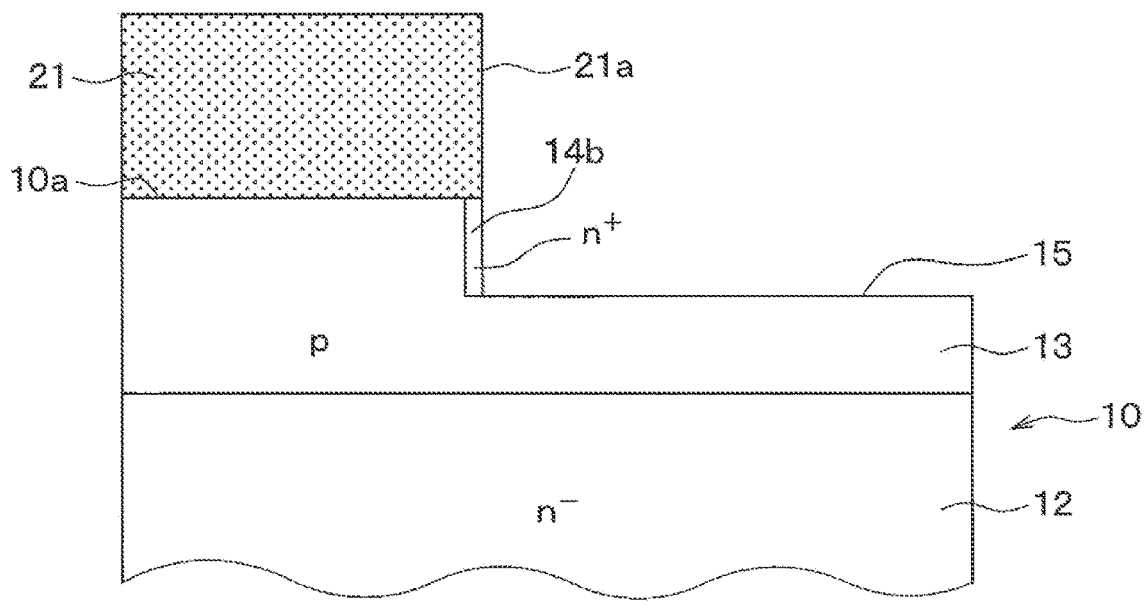
FIG. 8D is a cross-sectional view of a manufacturing process of the semiconductor device following FIG. 8C.

Subsequently, as illustrated in FIG. 8D, the interlayer insulating film 21 is adopted as the mask, and the contact trench 15 is formed. The contact trench 15 communicates with the first contact hole 21a and penetrates the contact region 14b for the source region. Therefore, the contact region 14b for the source region is formed around the contact trench 15.

Although the subsequent process is not particularly shown, the interlayer insulating film 21 is adopted as the mask, and the ion implantation of impurities for forming the contact region 13b for the body region through the first contact hole 21a and the contact trench 15 is performed, and then the thermal diffusion is performed. Therefore, the contact region 13b for the body region is formed at the bottom surface side of the contact trench 15. The semiconductor device is manufactured by forming, for example, the upper electrode 22 through a predetermined semiconductor manufacturing process.

According to the present embodiment, the contact trench 15 extends to the peripheral portion 2. The contact region 14b for the source region is formed such that d/A is 0.1 or smaller. Accordingly, it is possible to enhance the avalanche resistance while decreasing the fluctuation of the ratio between the current flowing through the main cell region Rm and the current flowing through the sense cell region Rs. Therefore, it is possible to enhance the avalanche resistance while inhibiting a decrease in the precision of detecting the current in the semiconductor device according to the present embodiment.

Second Embodiment

The following describes a second embodiment. The present embodiment is different from the first embodiment such that the upper electrode 22 is electrically connected to the body region 13 also in the peripheral portion 2. The other configurations are the same as those of the first embodiment, and therefore a description of the same configurations will be omitted below.

Figure 10:
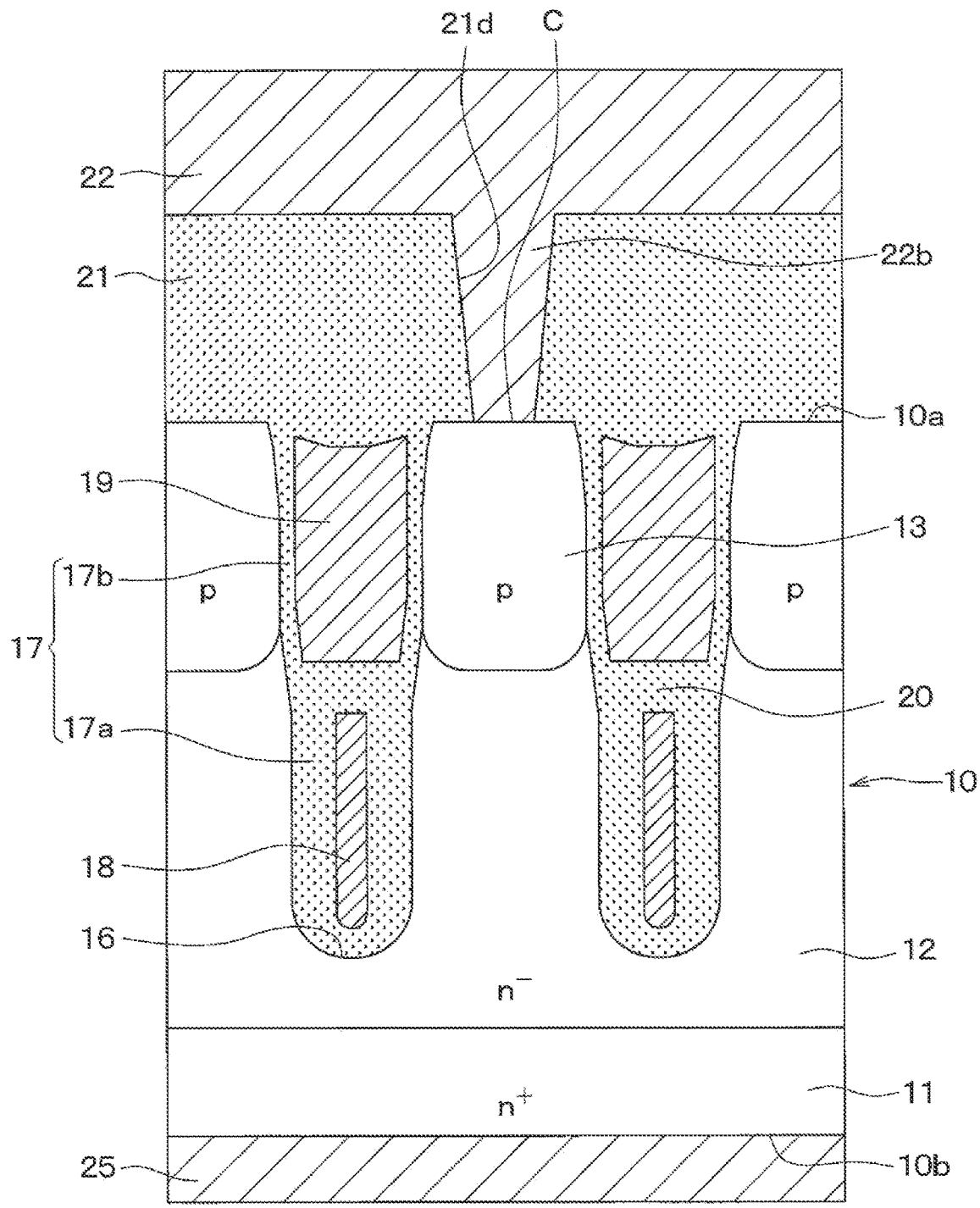
FIG. 10 is a cross-sectional view taken along a line X-X in FIG. 9.

In the present embodiment, as illustrated in FIGS. 9 and 10, a fourth contact hole 21d is formed at the interlayer insulating film 21 in the peripheral portion 2. The fourth contact hole 21d exposes the surface of the body region 13. In the peripheral portion 2, the upper electrode 22 is also connected to the body region 13 through a connecting portion 22b made of, for example, a tungsten (W) plug embedded in the fourth contact hole 21d formed at the interlayer insulating film 21. A contact portion C connected to the upper electrode 22 is formed at the body region 13 formed at the peripheral portion 2.

According to the present embodiment, in the peripheral portion 2, the body region 13 has the contact portion C electrically connected to the upper electrode 22. The upper electrode 22 is connected to the contact portion C of the body region 13 in the peripheral portion 2. When the semiconductor device has the avalanche operation, holes are easily extracted from the upper electrode 22 through the contact portion C in the peripheral portion 2. As a result, it is possible to enhance the breakdown voltage of the semiconductor device by further enhancing the avalanche resistance.

Third Embodiment

The following describes a third embodiment. The present embodiment is different from the first embodiment such that the protruding length d is made to be shorter than the protruding length of the contact trench 15. The other configurations are the same as those of the first embodiment, and therefore a description of the same configurations will be omitted below.

Figure 11:
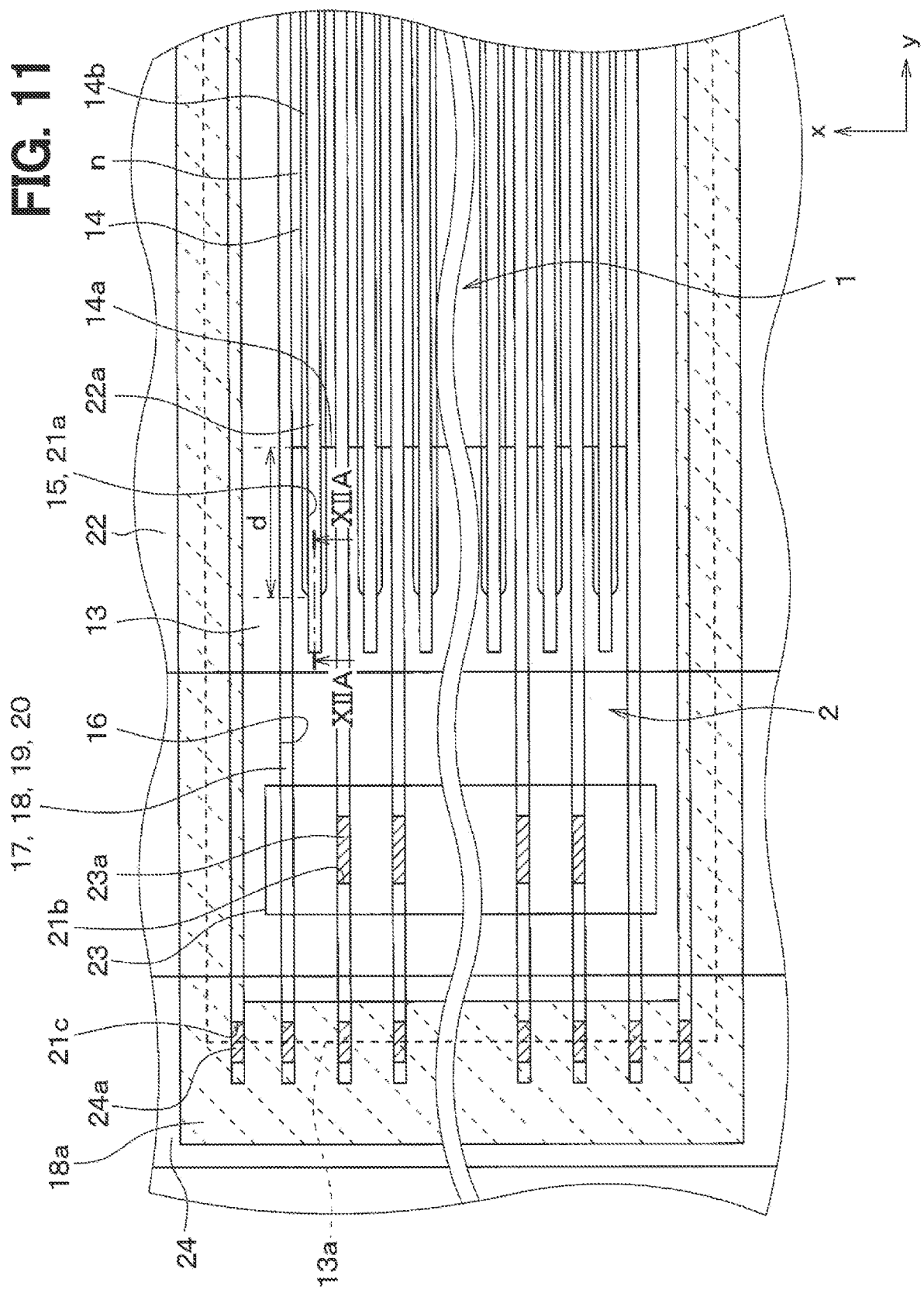
FIG. 11 is an upper surface layout diagram of a semiconductor device according to a third embodiment.

In the present embodiment, as illustrated in FIG. 11, the protruding length d of the contact region 14b for the source region is made to be shorter than the protruding length of the contact trench 15. The contact region 14b for the source region is formed such that d/A is 0.1 or smaller also in the present embodiment. The protruding length of the contact trench 15 is a length of a section of the contact trench 15 protruding from the cell portion 1 in the y-direction.

The structure of the semiconductor device according to the present embodiment has been described above. The following describes a manufacturing method related to the contact trench 15 and the contact region 14b for the source region in such a semiconductor device with reference to FIGS. 12A, 12B. Each of FIGS. 12A and 12B corresponds to a cross-sectional view taken along a XIIA-XIIA line in FIG. 10.

Figure 12A:
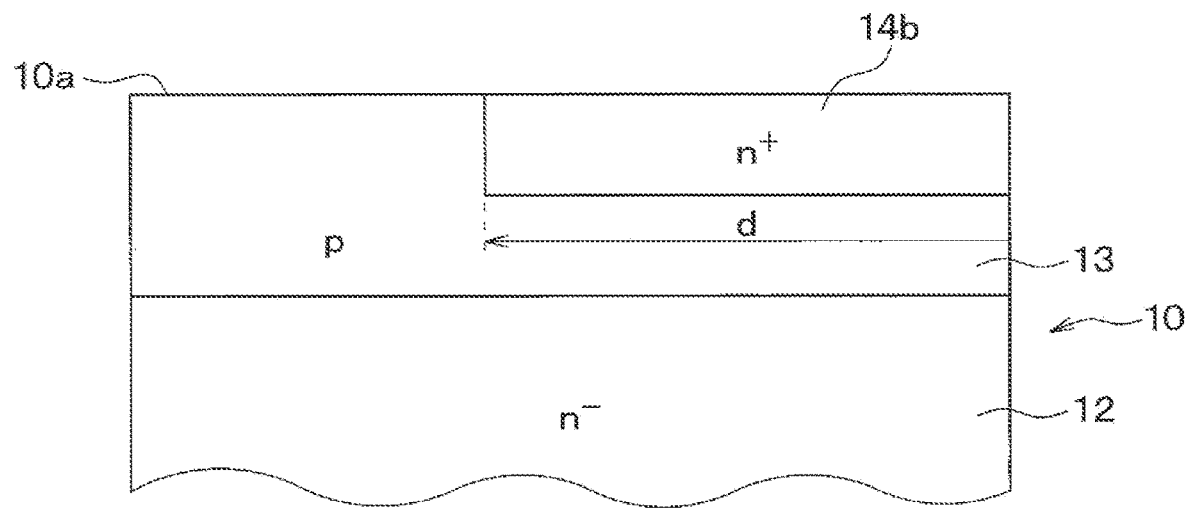
FIG. 12A is a cross-sectional view of a manufacturing process of the semiconductor device according to the third embodiment.

As illustrated in FIG. 12A, after preparing the semiconductor substrate 10 in which, for example, the body region 13 and the source region 14 are formed, the contact region 14b for the source region is formed by adopting the mask (not shown). The contact region 14b for the source region is formed such that d/A is 0.1 or smaller.

Figure 12B:
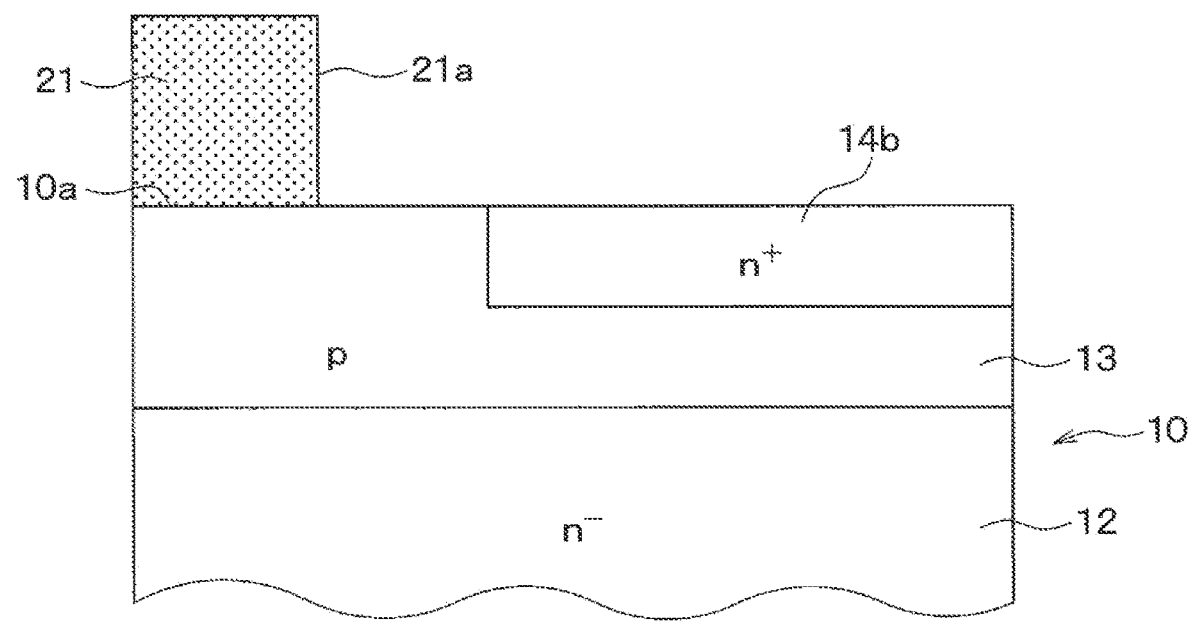
FIG. 12B is a manufacturing process of the semiconductor device following FIG. 12A.

Subsequently, as illustrated in FIG. 12B, the interlayer insulating film 21 is formed at the first surface 10a of the semiconductor substrate 10, and the first contact hole 21a is formed at the interlayer insulating film 21. The first contact hole 21a is formed to protrude from the contact region 14b for the source region in the y-direction. The first contact hole 21a is formed to expose the contact region 14b for the source region and the body region 13 in the y-direction.

Subsequently, although not particularly shown, the interlayer insulating film 21 is adopted as the mask, and the contact trench 15 is formed. The contact trench 15 communicates with the first contact hole 21a and penetrates the contact region 14b for the source region. In the present embodiment, the contact region 14b for the source region and the contact trench 15 are formed by adopting different masks.

As described above, even though the protruding length d of the contact region 14b for the source region is made to be shorter than the protruding length of the contact trench 15, the present embodiment can acquire an advantageous effect identical to the one in the first embodiment, as long as d/A is smaller than or equal to 0.1. By forming the contact region 14b for the source region and the contact trench 15 with different masks, it is possible to easily differentiate the protruding length d of the contact region 14b for the source region and the protruding length of the contact trench 15.

Other Embodiments

Although the present disclosure has been described in accordance with the embodiments, it is understood that the present disclosure is not limited to such embodiments or structures. The present disclosure encompasses various modifications and variations within the scope of equivalents. In addition, while the various elements are shown in various combinations and configurations, which are exemplary, other combinations and configurations, including more, less or only a single element, are also within the spirit and scope of the present disclosure.

In each of the above embodiments described above, the MOSFET of the n-channel trench-gate structure in which the first conductivity type is n-type and the second conductivity type is p-type has been described as an example of the semiconductor device. However, this is merely an example, and a semiconductor device of another structure, for example, a MOSFET of a trench-gate structure of a p-channel type in which the conductivity type of each component is inverted with respect to the n-channel type may also be used. Other than the MOSFET, the semiconductor device may be formed with an IGBT with a similar structure. In the case of IGBT, the $n^+$ type substrate 11 in each of the embodiments is modified to the $p^+$ type collector layer. Other than that, IGBT is similar to the MOSFET as described in each of the embodiments.

The third embodiment describes that the contact region 14b for the source region is formed before the formation of the interlayer insulating film 21. However, the following may also be applied. After the first contact hole 21a is formed at the interlayer insulating film 21, a mask having an opening formed to have d/A being 0.1 or smaller is arranged to form the contact region 14b for the source region. Subsequently, the interlayer insulating film may be adopted as the mask to form the contact trench 15.

In addition, each of the above embodiments can be combined as appropriate to form the semiconductor device. For example, the second embodiment may be combined with the third embodiment such that the body region 13 may be connected to the upper electrode 22 in the peripheral portion 2.

What is claimed is:

1. A semiconductor device comprising:
a cell portion including a main cell region and a sense cell region, the cell portion having a semiconductor element in each of the main cell region and the sense cell region, the main cell region having a structure identical to the sense cell region, the sense cell region configured to enable a flow of a smaller current than the main cell region; and
a peripheral portion surrounding the cell portion, wherein the semiconductor element in each of the main cell region and the sense cell region includes:
  a semiconductor substrate being a first conductivity type and having a drift layer;
  a first impurity region located on the drift layer and being a second conductivity type;
  a second impurity region located on a surface layer portion of the first impurity region, the second impurity region being a first conductivity type and having a higher impurity concentration than the drift layer;
  a plurality of trench-gate structures arranged in a stripe shape, each of the plurality of trench-gate structures including a gate trench, a shield electrode, an intermediate insulating film, a gate electrode, and an insulating film, the gate trench having one direction as a longitudinal direction of the gate trench while penetrating the first impurity region from the second impurity region and reaching the drift layer, each of the plurality of trench-gate structures configured to have double gates by stacking the shield electrode, the intermediate insulating film and the gate electrode in order via the insulating film in the gate trench;
  a contact trench located between adjacent two of the plurality of trench-gate structures, the contact trench having the one direction as a longitudinal direction of the contact trench, the contact trench extending from the cell portion to the peripheral portion while penetrating the second impurity region and reaching the first impurity region;
  a contact region configured for the second impurity region, the contact region located along a wall surface of the contact trench, the contact region having a higher impurity concentration than the second impurity region;
  a high-concentration layer being the first conductivity type or the second conductivity type, the high-concentration layer located on a side opposite from the first impurity region with the drift layer sandwiched between the first impurity region and the high-concentration layer;
  an interlayer insulating film having a contact hole communicating with the contact trench, the interlayer insulating film located on the first impurity region, the second impurity region, and the plurality of trench-gate structures;
  a first electrode electrically connected to the contact region and the first impurity region through the contact hole and the contact trench; and
  a second electrode electrically connected to the high-concentration layer,
a length of the cell portion in the one direction is identical to a length of the second impurity region in the one direction,
the contact region extends from the cell portion to the peripheral portion,
a length of a section of the contact region located at the peripheral portion in the one direction is defined as a protruding length, and the length of the second impurity region in the one direction is defined as a second-impurity-region length, and
a ratio of the protruding length to the second-impurity-region length is 0.1 or smaller.

2. The semiconductor device according to claim 1, wherein
the first impurity region extends from the cell portion to the peripheral portion,
the peripheral portion has a section facing the cell portion in the one direction,
the interlayer insulating film has a contact hole at the section of the peripheral portion,
the contact hole exposes the first impurity region, and
the first electrode is electrically connected to the first impurity region through the contact hole in the peripheral portion.

3. The semiconductor device according to claim 1, wherein the contact region surrounds the contact trench.

4. A method of manufacturing a semiconductor device, the method comprising:
preparing a semiconductor substrate;
forming a contact region for a second impurity region; and
forming a contact trench at the semiconductor substrate, wherein
the semiconductor device includes a cell portion and a peripheral portion surrounding the cell portion,
the cell portion includes a main cell region and a sense cell region,
the cell portion includes a semiconductor element in each of the main cell region and the sense cell region,
the sense cell region has a structure identical to the main cell region,
the sense cell region is configured to enable a flow of a smaller current than the main cell region,
the semiconductor element in each of the main cell region and the sense cell region includes:
  the semiconductor substrate being a first conductivity type and having a drift layer;
  a first impurity region formed on the drift layer and being a second conductivity type;
  the second impurity region formed on a surface layer portion of the first impurity region, the second impurity region being a first conductivity type and having a higher impurity concentration than the drift layer;
  a plurality of trench-gate structures arranged in a stripe shape, each of the plurality of trench-gate structures including a gate trench, a shield electrode, an intermediate insulating film, a gate electrode, and an insulating film, the gate trench having one direction as a longitudinal direction of the gate trench while penetrating the first impurity region from the second impurity region and reaching the drift layer, each of the plurality of trench-gate structures configured to have double gates by stacking the shield electrode, the intermediate insulating film and the gate electrode in order via the insulating film in the gate trench;
  the contact trench formed between adjacent two of the plurality of trench-gate structures, the contact trench having the one direction as a longitudinal direction of the contact trench, the contact trench extending from the cell portion to the peripheral portion while penetrating the second impurity region and reaching the first impurity region;

the contact region formed along a wall surface of the contact trench, the contact region having a higher impurity concentration than the second impurity region;

a high-concentration layer being the first conductivity type or the second conductivity type, the high-concentration layer arranged on a side opposite from the first impurity region with the drift layer sandwiched between the first impurity region and the high-concentration layer;

an interlayer insulating film formed with a contact hole communicating with the contact trench, the interlayer insulating film arranged on the first impurity region, the second impurity region, and the plurality of trench-gate structures;

a first electrode electrically connected to the contact region and the first impurity region through the contact hole and the contact trench; and a second electrode electrically connected to the high-concentration layer, a length of the cell portion in the one direction is set to be identical to a length of the second impurity region in the one direction, the contact region is formed to extend from the cell portion to the peripheral portion, a length of a section of the contact region at the peripheral portion in the one direction is defined as a protruding length, the length of the second impurity region in the one direction is defined as a second-impurity-region length, and the forming of the contact region includes setting a ratio of the protruding length to the second-impurity-region length to be 0.1 or smaller.

5. The method according to claim 4, wherein an identical mask is adopted in both of the forming of the contact region and the forming of the contact trench.

6. The method according to claim 5, further comprising:

forming the interlayer insulating film on the semiconductor substrate after the preparing of the semiconductor substrate; and forming the contact hole at the interlayer insulating film after the forming of the interlayer insulating film, wherein the forming of the contact region includes:
  adopting the interlayer insulating film as the identical mask; and
  performing ion-implantation of impurities to the semiconductor substrate through the contact hole and thermal diffusion of the impurities to form the contact region, and the forming of the contact trench includes:
  adopting the interlayer insulating film as the identical mask; and
  forming the contact trench to communicate with the contact hole and penetrate the contact region.

7. The method according to claim 4, wherein a mask adopted in the forming of the contact region is different from a mask adopted in the forming of the contact trench.

* * * * *